(12) United States Patent
Chong et al.

(10) Patent No.: US 9,871,529 B1
(45) Date of Patent: Jan. 16, 2018

(54) ASYNCHRONOUS SAR ADC WITH CONVERSION SPEED CONTROL FEEDBACK LOOP

(71) Applicants: Euhan Chong, Ottawa (CA); Semyon Lebedev, Ottawa (CA); Marc-Andre LaCroix, Ottawa (CA)

(72) Inventors: Euhan Chong, Ottawa (CA); Semyon Lebedev, Ottawa (CA); Marc-Andre LaCroix, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/425,653

(22) Filed: Feb. 6, 2017

(51) Int. Cl.
*H03M 1/38* (2006.01)
*H03M 1/12* (2006.01)
*H03M 1/00* (2006.01)
*H03M 1/06* (2006.01)

(52) U.S. Cl.
CPC ............ *H03M 1/38* (2013.01); *H03M 1/002* (2013.01); *H03M 1/121* (2013.01); *H03M 1/125* (2013.01); *H03M 1/00* (2013.01); *H03M 1/0695* (2013.01); *H03M 1/12* (2013.01)

(58) Field of Classification Search
CPC ......... H03M 1/0695; H03M 1/12; H03M 1/00
USPC ................. 341/161, 155, 120, 122
See application file for complete search history.

(56) References Cited

U.S. PATENT DOCUMENTS 9,614,539 B2 * 4/2017 Tang ..................... H03M 1/466

* cited by examiner

*Primary Examiner* — Joseph Lauture

(57) ABSTRACT

Systems and circuits for feedback control of an asynchronous successive approximation register (SAR) analog-to-digital converter (ADC) are described. An example system includes the asynchronous SAR ADC. A timing detector circuit is coupled to the asynchronous SAR ADC to receive one or more internal signals from the asynchronous SAR ADC. The timing detector circuit outputs a timing detector signal representing an internal timing of the SAR ADC. The timing detector signal is generated based on the one or more internal signals. A regulator circuit is coupled to the timing detector circuit to receive the timing detector signal. The regulator circuit is also coupled to the asynchronous SAR ADC to output a feedback signal to the asynchronous SAR ADC. The feedback signal is generated based on the timing detector signal to control the internal timing of the SAR ADC to match a target timing.

20 Claims, 10 Drawing Sheets

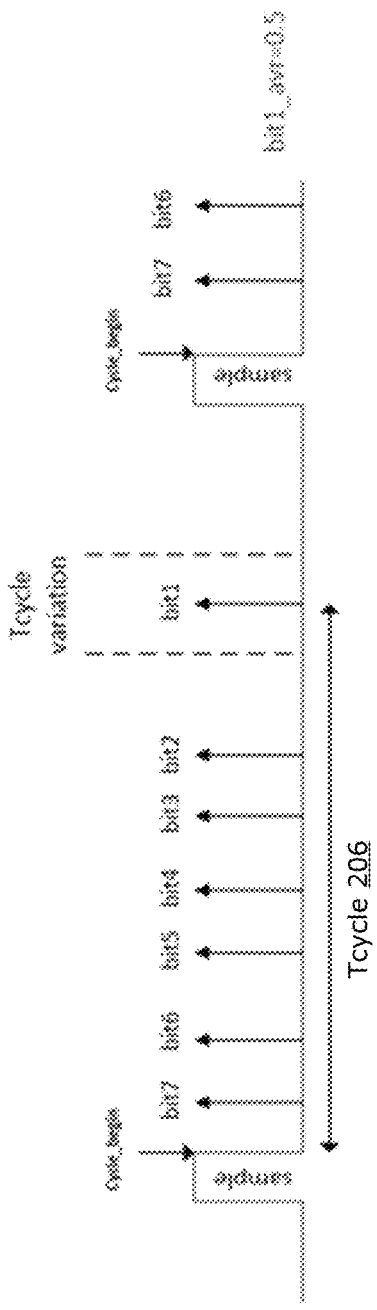
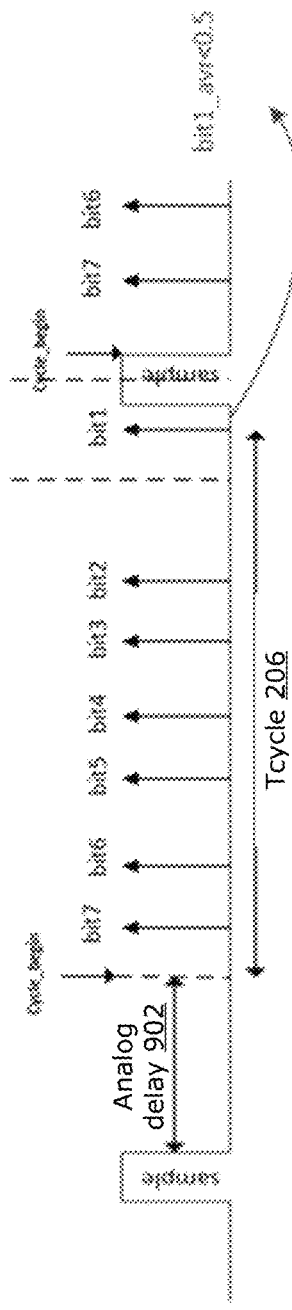
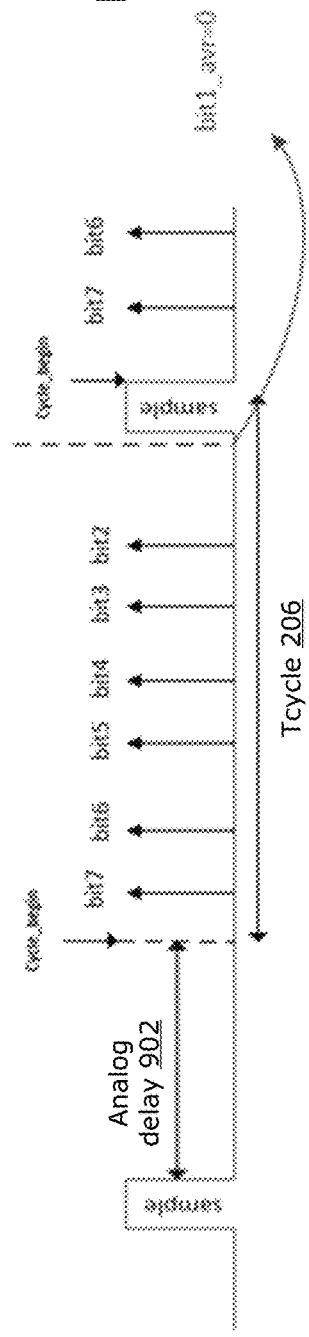
FIG. 9A
FIG. 9B
FIG. 9C

ASYNCHRONOUS SAR ADC WITH CONVERSION SPEED CONTROL FEEDBACK LOOP

FIELD

The present disclosure is related to successive approximation register (SAR) analog-to-digital converters (ADCs), and circuits for feedback and conversion speed control of SAR ADCs.

BACKGROUND

The asynchronous successive approximation register (SAR) analog-to-digital converter (ADC) is a mixed signal design with an external sampling clock and an internally generated asynchronous clock for producing successive digital N-bit outputs. In order for all N-bits to be properly received, it is necessary that the cycle of the external clock is sufficiently long to allow all N bits to be received based on the internal asynchronous clock.

The clock cycle of the external sampling clock is generally constant and known. However, the internal asynchronous clock has a variable cycle that can vary from bit to bit and from sample to sample. The average cycle length may also vary with temperature and process corner. Thus, normally the external clock speed is set sufficiently slow to ensure that even in the worst case scenario all N bits, which are dependent on the speed of the internal clock, would be received. There are currently no ways to measure or automatically regulate the cycle time of the internal asynchronous clock.

SUMMARY

The present disclosure describes methods for measuring the average cycle time of the SAR internal asynchronous clock. The present disclosure further describes methods for controlling the average cycle time of the SAR internal asynchronous clock. The measurement and control loop may be useful for optimization of ADC speed, power and performance. Further, because the SAR ADC internal clock speed is largely dependent on digital internal delays, a measurement of the SAR internal clock average cycle time may also be useful as a process and temperature detector. In the case of an interleaved ADC, a measurement of cycle time can be used to obtain sub-channel asynchronous clock variation statistics. This information may be useful for adjusting the speed of each sub-channel independently, to enable possible power savings by running each ADC sub-channel only as fast as necessary.

According to some aspects there is disclosed herein a system for feedback control of an asynchronous successive approximation register (SAR) analog-to-digital converter (ADC). The system comprises the asynchronous SAR ADC being configured to receive an analog input signal and output a digital output signal, and the SAR ADC being configured to receive an external sampling clock for sampling the analog input signal and configured to generate an asynchronous internal timing related to conversion of the analog input signal. The system also comprises a timing detector circuit coupled to the asynchronous SAR ADC to receive one or more internal signals from the asynchronous SAR ADC, and the timing detector circuit being configured to output a timing detector signal representing the internal timing of the SAR ADC, the timing detector signal being generated based on the one or more internal signals. The system also further comprises a regulator circuit coupled to the timing detector circuit to receive the timing detector signal, the regulator circuit also coupled to the asynchronous SAR ADC to output a feedback signal to the asynchronous SAR ADC, and the feedback signal being generated based on the timing detector signal to control the internal timing of the SAR ADC to match a target timing.

According to some further aspects there is disclosed herein a circuit for detecting an internal timing of an asynchronous successive approximation register (SAR) analog-to-digital converter (ADC). The circuit comprises a timing detector circuit coupled to the asynchronous SAR ADC to receive one or more internal signals from the asynchronous SAR ADC, the timing detector circuit being configured to output a timing detector signal representing the internal timing of the SAR ADC, the timing detector signal being generated based on the one or more internal signals.

According to some still further aspects there is disclosed herein a system for feedback control of an interleaved asynchronous successive approximation register (SAR) analog-to-digital converter (ADC), comprising the interleaved asynchronous SAR ADC having multiple sub-channels. Each sub-channel has a respective internal timing related to conversion of an analog input signal to a digital output signal. The system also comprises a plurality of timing detector circuits, each timing detector circuit being coupled to a respective sub-channel for detecting the internal timing of the respective sub-channel, and each timing detector circuit being configured to output a respective timing detector signal representing the internal timing of the respective sub-channel.

According to the previous aspects, some embodiments are disclosed wherein the one or more internal signals comprise at least two trigger signals indicating respective events at the SAR ADC, and wherein the timing detector signal is generated to represent the internal timing by representing an average time delay between the events based on the at least two trigger signals.

According to the previous aspects and embodiments, further embodiments are disclosed wherein the timing detector circuit comprises a delay-to-pulse-width converter for converting time delay between the events to a pulse width of a pulse signal, wherein a duty cycle of the pulse signal is directly proportional to a ratio of the time delay to a external sampling clock cycle.

According to the previous aspects and embodiments, further embodiments are disclosed wherein the timing detector circuit further comprises a low-pass filter for converting the duty cycle to the timing detector signal having a voltage proportional to an average duty cycle.

According to the previous aspects and embodiments, further embodiments are disclosed wherein the at least two trigger signals comprise a first trigger signal indicating a pulse of the external sampling clock and a second trigger signal indicating a last bits of a digitized sample, wherein the average time delay is equal to an average cycle of an asynchronous internal clock of the SAR ADC.

According to the previous aspects and embodiments, further embodiments are disclosed wherein the SAR ADC is configured to receive a probe signal, the probe signal causing a change in the one or more internal signals, the change in the one or more internal signals being indicative of the internal timing of the SAR ADC.

According to the previous embodiment, further embodiments are disclosed wherein the one or more internal signals comprise a bit value signal representing a value of a bit of the digital output signal, wherein the probe signal inserts an analog delay in the conversion of the analog input signal, and wherein the timing detector signal is generated to represent the internal timing by calculating an average value of the bit, wherein the average value of the bit is changed when the inserted analog delay exceeds a waiting time of the SAR ADC.

BRIEF DESCRIPTION OF THE DRAWINGS

Reference will now be made, by way of example, to the accompanying drawings which show example embodiments of the present application, and in which:

FIGS. 9A-9C illustrate insertion of an analog delay to detect the average asynchronous internal clock cycle of a SAR ADC, using a digital indicator.

Similar reference numerals may have been used in different figures to denote similar components.

DESCRIPTION OF EXAMPLE EMBODIMENTS

Figure 1:
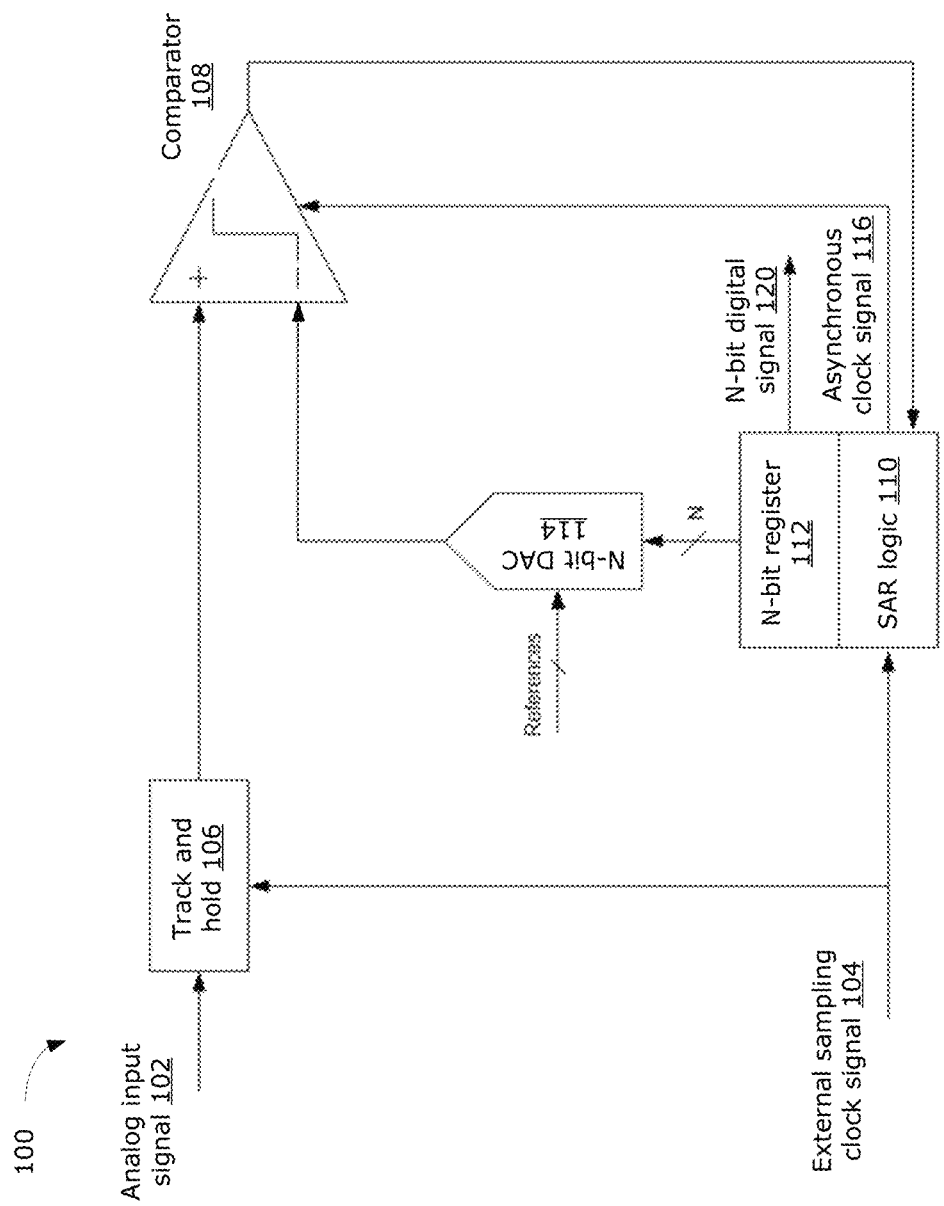
FIG. 1 is a schematic diagram illustrating an example asynchronous SAR ADC.
Figure 2:
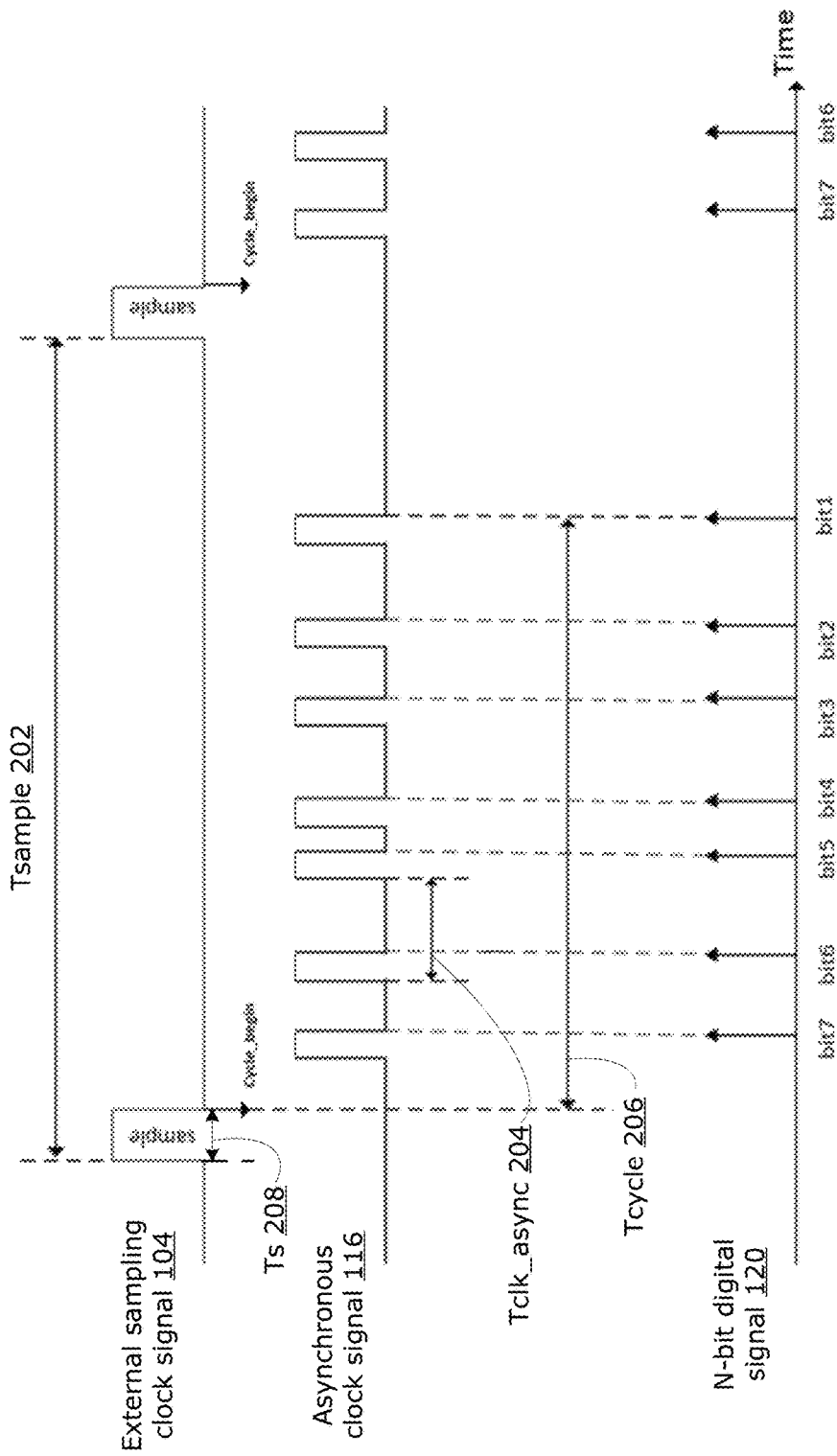
FIG. 2 is an example timing diagram for the asynchronous SAR ADC of FIG. 1.

FIG. 1 is a schematic diagram of an example asynchronous successive approximation register (SAR) analog-to-digital converter (ADC) 100. In this example, the SAR ADC 100 converts N-bits. The SAR ADC 100 receives as input an analog input signal 102 that is to be converted to digital, and an external sampling clock signal 104. The SAR ADC 100 includes a track and hold circuit 106, a comparator 108, a SAR logic circuit 110, an N-bit register 112, and an N-bit digital-to-analog converter (DAC) 114. The output of the SAR ADC 100 is an N-bit digital signal 120 (beginning with the most significant bit (MSB)), converted from the analog input signal 102. Notably, the external sampling clock triggers the beginning of a SAR conversion, then the SAR logic generates an internal asynchronous clock signal 116, which can be a single clock or multiple clocks in succession. The asynchronous clock signal 116 is provided as input to the comparator 108. In the case where the asynchronous clock signal 116 is from multiple clocks in succession, the asynchronous clock signal 116 may be provided as a set of signals to multiple comparators 108. An example timing diagram for the SAR ADC 100 is shown in FIG. 2. The external clock cycle (Tsample) 202 is constant. The internal asynchronous comparator clock cycle (Tclk_async) 204 can vary, depending on input signal value, process and temperature, for example.

The time for each bit sub-cycle may be dependent on the internal convergence time of the N-bit DAC 114, which may be implemented as a capacitive DAC (CDAC). The CDAC convergence time may be different depending on the differential voltage value seen at comparator inputs at each sub-cycle. For example, for smaller input signals a longer settling time is required for the CDAC. Although a differential voltage is discussed, the present disclosure may be applicable to different SAR circuits that have an asynchronous internal clock, including single-end or differential-end CDAC implementations and variations thereof.

The sum of all N-bit sub-cycles Tclk_async 204 is the final one-sample conversion time, Tcycle 206. For the asynchronous SAR ADC 100, it is necessary that Tcycle 206 be less than or equal to the value (Tsample–Ts) (where Ts 208 is the duration of a sampling strobe pulse), for any period of time and for all process corners including the worst case (which represent the most extreme parameters under which the SAR ADC 100 much function) in order to receive all N-bits. Conventionally, this is guaranteed by ensuring that this timing requirement is still satisfied in the worst case process corner (in which Tcycle is longest), by over-designing the SAR ADC 100 to be sufficiently fast in even the worst case scenario.

However, this conventional approach, in which the SAR ADC 100 is designed to account for the slowest possible process corner, may be overly conservative, with the result that the SAR ADC 100 has excessive waiting time between the last bit of one sample and the start of the next sample, such that Tcycle 206 is much shorter than (Tsample–Ts) in the majority of process corners. This means that the SAR ADC 100 may be needlessly consuming power resources most of the time. In the case of an interleaved SAR, where there are M sub-channels (e.g., 32 sub-channels or more), this problem is compounded because all sub-channels are similarly over-designed for the worst case scenario. Further, all sub-channels of an interleaved SAR are typically designed to perform at the same speed, which may be inefficient where different sub-channels carry greater or fewer numbers of bits.

In examples described below, the averaged value of Tcycle 206 over a larger number of clock cycles (Tcycle_avg) may be used as a metric that is indicative of the internal speed of the SAR ADC 100. Using a signal representative of Tcycle_avg, the timing of the SAR ADC 100 may be adjusted or regulated using a feedback circuit and control loop. It may be sufficient to perform this feedback based on Tcycle_avg; individual (non-averaged) values of Tcycle or Tclk_async at each sample may remain unknown.

Figure 3:
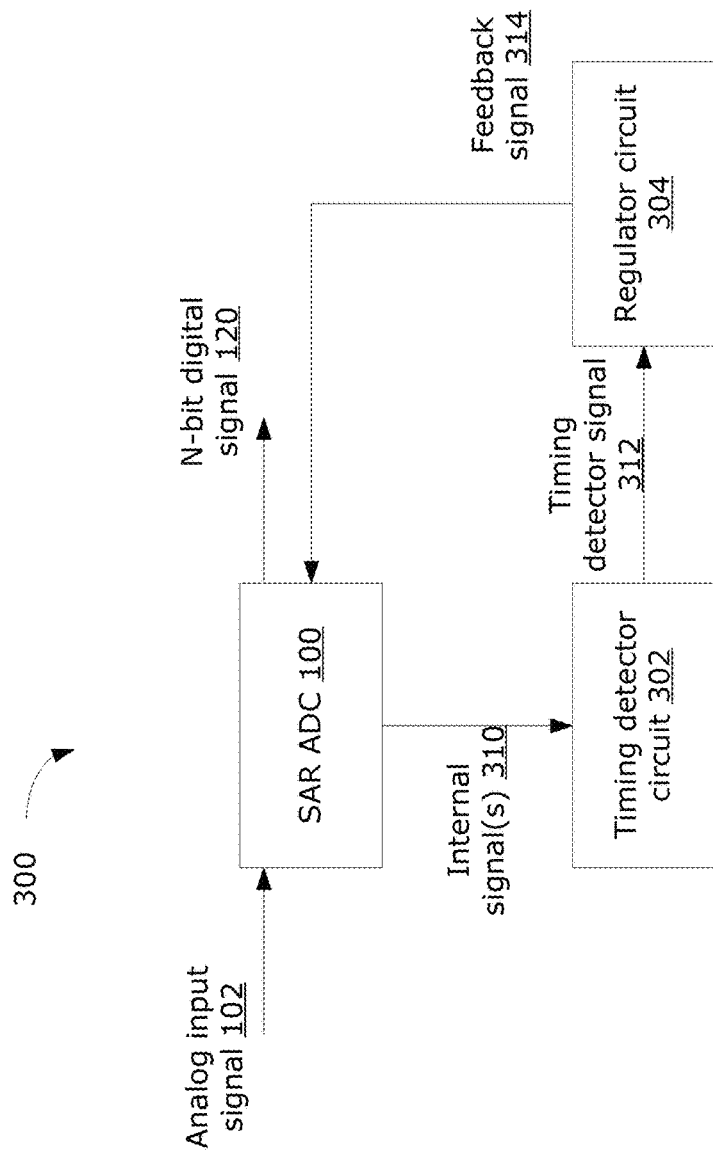
FIG. 3 is a schematic diagram illustrating an example system for a SAR ADC, including an example feedback control loop for controlling timing of the SAR ADC.

FIG. 3 is a schematic diagram of an example closed-loop system 300 for a SAR ADC, including a feedback control loop for regulating timing of the SAR ADC 100. The example shown in FIG. 3 is a general block diagram, and detailed example implementations will be described further below.

The system 300 includes the SAR ADC 100, a timing detector circuit 302, and a regulator control circuit 304. As described above, the SAR ADC 100 receives an analog input signal 102 and outputs an N-bit digital output signal 120. The timing detector circuit 302 receives one or more internal signals 310 from the SAR ADC 100. The internal signal(s) 310 may represent any parameter(s) of the SAR ADC 100 that is correlated to the internal speed. The internal signal(s) 310 may include trigger signals indicating occurrence of an event at the SAR ADC 100 (e.g., the rising edge of an internal clock pulse) or a signal representing the value of an SAR output bit, for example. The timing detector circuit 302 outputs a timing detector signal 312 representing the Tcycle_avg determined based on the internal signals 310 from the SAR ADC 100. The timing detector signal 312 may be used as a metric of the SAR ADC 100 internal timing.

The timing detector signal 312 is inputted to the regulator circuit 304. The regulator circuit 304 compares the timing detector signal 312, which represents a metric for the internal speed of the SAR ADC 100, to a target value and outputs a feedback signal 314 to control the performance of the SAR ADC 100. The regulator circuit 304 may be controlled, for example by a control signal from a processor (not shown) to regulate the SAR ADC 100 to a desired target internal timing. The regulator circuit 304 may then output a feedback signal 314 to the SAR ADC 100 to adjust the speed of the internal asynchronous clock to achieve the desired target timing. In some examples, the feedback signal 314 may be an analog signal that can be used directly to control the supply voltage of the SAR ADC 100, to control the speed of the internal asynchronous clock (e.g., increase the supply voltage to increase the speed, or decrease the supply voltage to decrease the speed). In other examples, the feedback signal 314 may adjust the reference currents provided to the SAR ADC 100 or change the configuration settings of the SAR ADC 100, among other possible control means. Such feedback may be used to regulate or optimize the timing of the SAR ADC 100. It should be understood that "optimize" is not restricted to mean a strict "optimal" performance, but rather that that the system may be controlled to achieve a desired performance.

Figure 4:
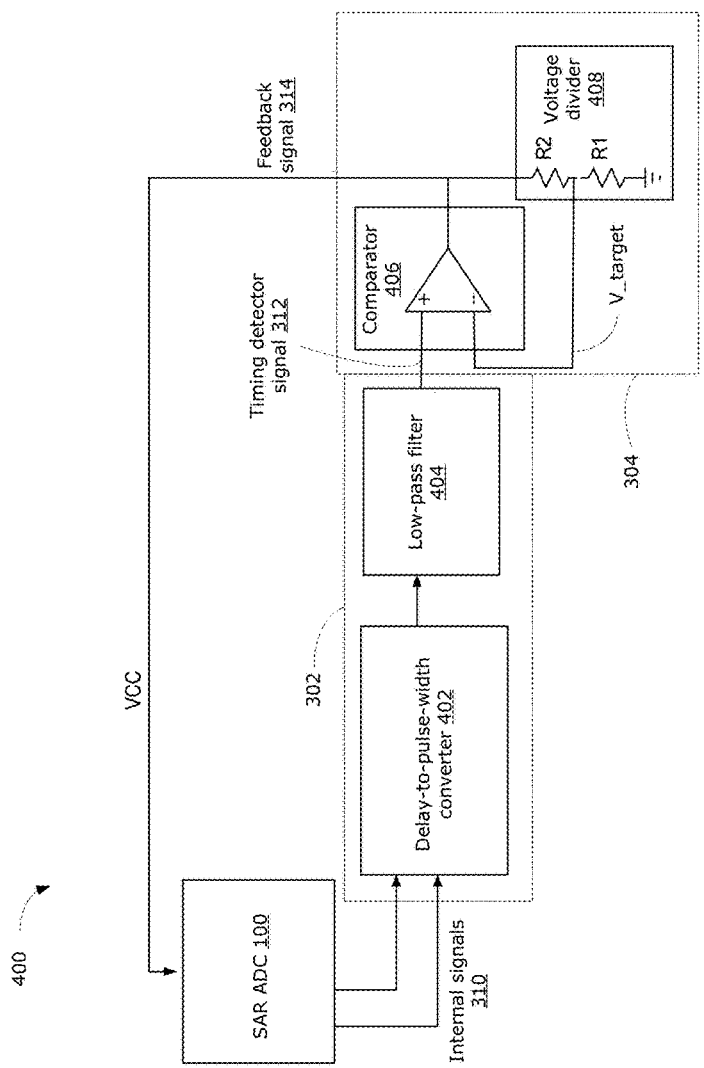
FIG. 4 shows an example implementation of a feedback circuit for controlling timing of a SAR ADC.

FIG. 4 is a schematic diagram illustrating an example of a closed-loop system for the SAR ADC 100, showing example implementation of the feedback circuit and control loop. The example system 400 shows an example of analog implementation. In the example system 400 of FIG. 4, the timing detector circuit 302 includes a delay-to-pulse-width converter 402 and a low-pass filter 404.

Figure 5:
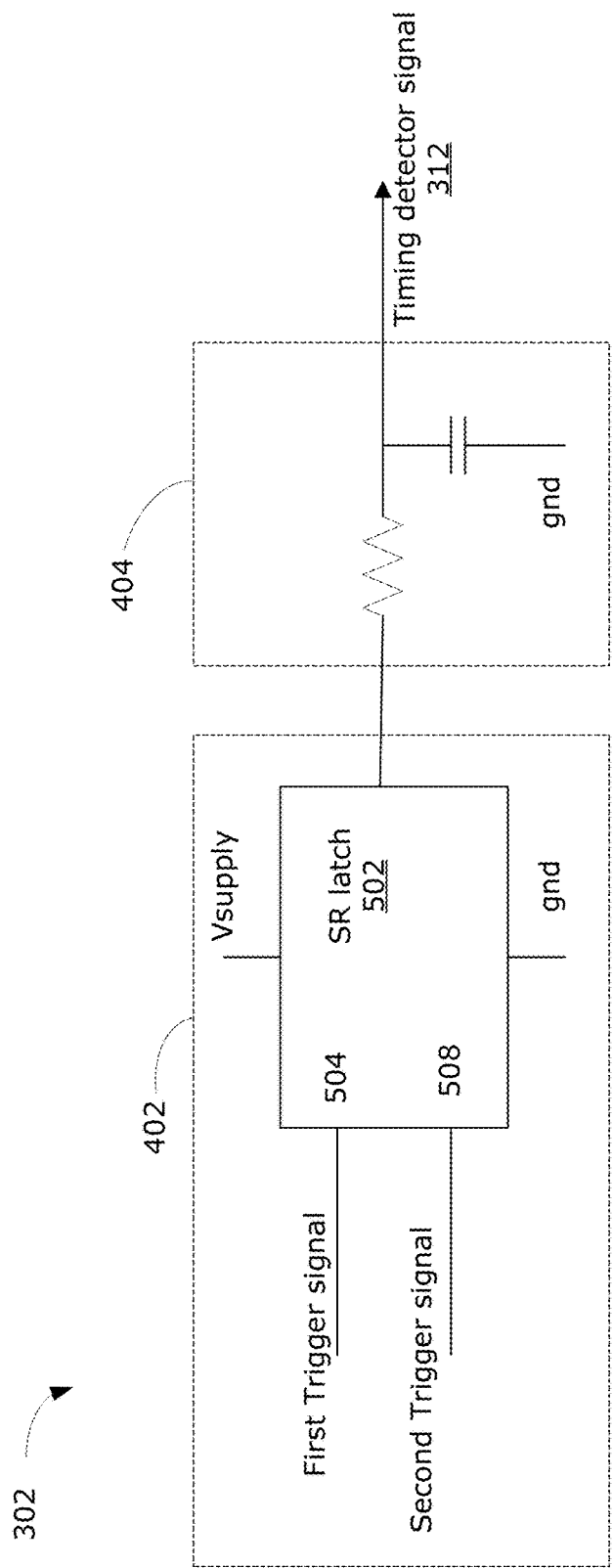
FIG. 5 shows an example implementation of an average conversion time detector circuit.

The internal signals 310 from the SAR ADC 100 are two trigger signals indicating the occurrence of respective events at the SAR ADC 100. For example, the two trigger signals may indicate the rising edge of the external clock signal and the rising edge of the asynchronous clock signal for the last bit in the sample (bit1 in the example of FIG. 2). The delay-to-pulse-width converter 402 generates a pulse signal with a pulse-width equal to the time delay between the two trigger signals (Tdelay). An example implementation of the delay-to-pulse-width converter 402 is shown in FIG. 5. In the example of FIG. 5, the delay-to-pulse-width converter 402 includes an SR latch 502, where the first internal trigger signal (e.g., rising edge of the sample clock) is connected to the "set" input 504 of SR latch and the second internal trigger signal (e.g., rising edge of the asynchronous clock pulse for bit1) goes to "reset" input 508 of SR latch. FIG. 5 also shows an example implementation of the low-pass filter 404 as an RC filter.

Over multiple samples, the output of the delay-to-pulse width converter 402 is a pulse signal with a duty cycle equal to Tdelay/Tsample. The low-pass filter 404 (e.g., an RC filter) converts this output into a voltage representing the average duty cycle, where Vout=Vcc*(Tdelay_avg/Tsample), where Vout is the output of the low-pass filter 404 (which is the timing detector signal 312), Vcc is the supply voltage, and Tdelay_avg is the average delay between the two trigger signals. The low-pass filter 404 may be designed to filter out the AC component and extract a DC voltage level of Vout (e.g., by adjusting the resistor and capacitor value in an RC filter to achieve a desired RC time constant). This DC voltage level may serve as a signal representing an average voltage over a desired time period (which may be related to Tdelay_avg or Tcycle_avg).

The regulator circuit 304 in this example includes an amplifier 406 and a controllable voltage divider 408. Input to the amplifier 406 is the timing detector signal 312 outputted from the low-pass filter 404 and a target voltage V_target from the voltage divider 408. The voltage divider 408 may be controlled via a control signal from a processor (not shown), for example, to set the V_target based on a desired target timing ratio (Tdelay_avg_target/Tsample), where Tdelay_avg_target is the target average time for the time delay between the two trigger signals of interest. In this way, the closed-loop system 400 uses feedback control to adjust Tdelay_avg to match Tdelay_avg_target (within the closed-loop gain accuracy).

For example, where the system 400 is used to regulate Tcycle, the two trigger signals may be the rise of the sample clock pulse and the rise of the asynchronous clock pulse for the last bit, such that Tdelay=Tcycle. In the example shown, the output from the voltage divider 408 is V_target=Vcc*R1/(R1+R2), where the resistor ratio may be controlled such that R1/(R1+R2)=(Tdelay_avg_target/Tsample). The regulator circuit 304 together with the feedback control loop establish a closed-loop system, which adjusts Vsupply level to meet the target average asynchronous conversion cycle time set by the ratio. Because the feedback signal 314 output from the regulator circuit 304 is an analog signal, the feedback signal 314 may be used directly to control the supply voltage of the SAR ADC 100. In other examples, the digital feedback may be used instead, for example by converting an analog feedback signal 314 to the digital domain. Conversion of the analog feedback signal 314 to a digital signal may be performed using any suitable method, for example using an on-chip slow, low-power dedicated measurement ADC. In some examples, the feedback signal 314 may also be extracted for use by external systems, such as for measurement by other testing equipment.

The system 400 may be used to regulate any time delay of interest in the SAR ADC 100, not necessarily only Tcycle. For example, any delay related to the internal asynchronous clock (e.g., time delay between two bits, or time delay from sample clock to the first bit) may be detected using the example system 400, by probing the appropriate internal signals 310 from the SAR ADC 100.

The example system 400 uses a negative feedback loop to regulate the SAR ADC 100 to a desired target speed. In some examples, measurement of the average internal conversion cycle may be performed continuously, or not continuously such as periodically on a dedicated clock basis, or other basis. This may enable the speed of the SAR ADC 100 to be kept fairly constant, maintaining a desired Tcycle_avg/Tsample ratio over any changes to the environment, including temperature change, external clock frequency change or any other environment change that affects internal conversion speed.

Figure 6:
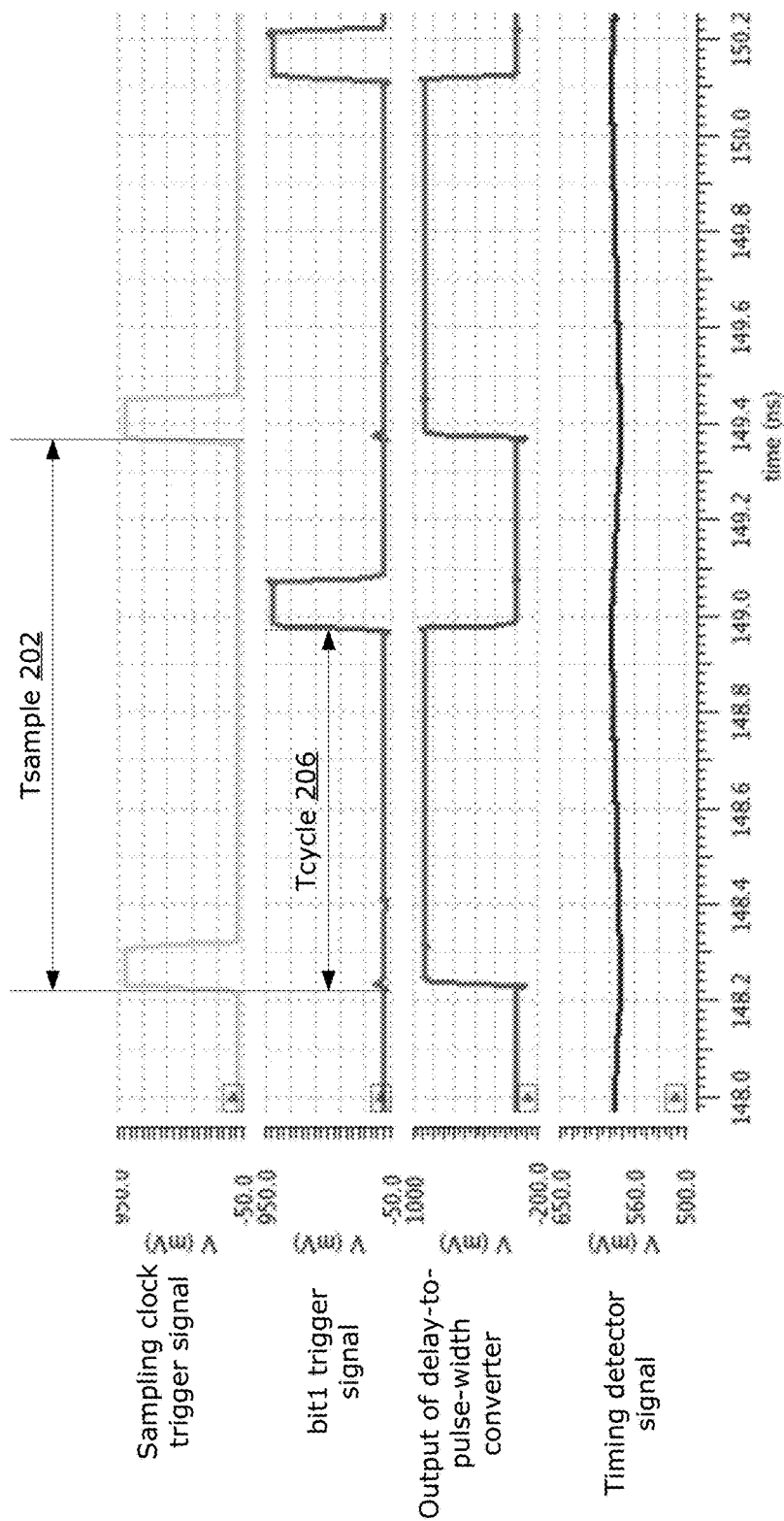
FIG. 6 is an example timing diagram illustrating detection of the asynchronous internal clock cycle of a SAR ADC.

FIG. 6 shows a set of example voltages for the example system 400, in which the delay between the external sampling clock and the last sampled bit (bit1) is the Tdelay detected by the timing detector circuit 302, in order to provide feedback control based on Tcycle. As seen in FIG. 6, the output of the delay-to-pulse-width converter 402 is a pulse with a rise edge triggered by the rising edge of the sampling clock signal and fall edge triggered by the rising edge of the bit1 signal, such that the width of the pulse is equal to Tcycle. It should be noted that the bit1 signal represents not a bit value, but a bit occurrence event. Thus, the output signal of the delay-to-pulse-width converter 402 has a duty cycle of Tcycle/Tsample. The low-pass filter 404 produces an output representing the duty cycle averaged over time: Vout=Vcc*(Tcycle_avg/Tsample).

Figure 7:
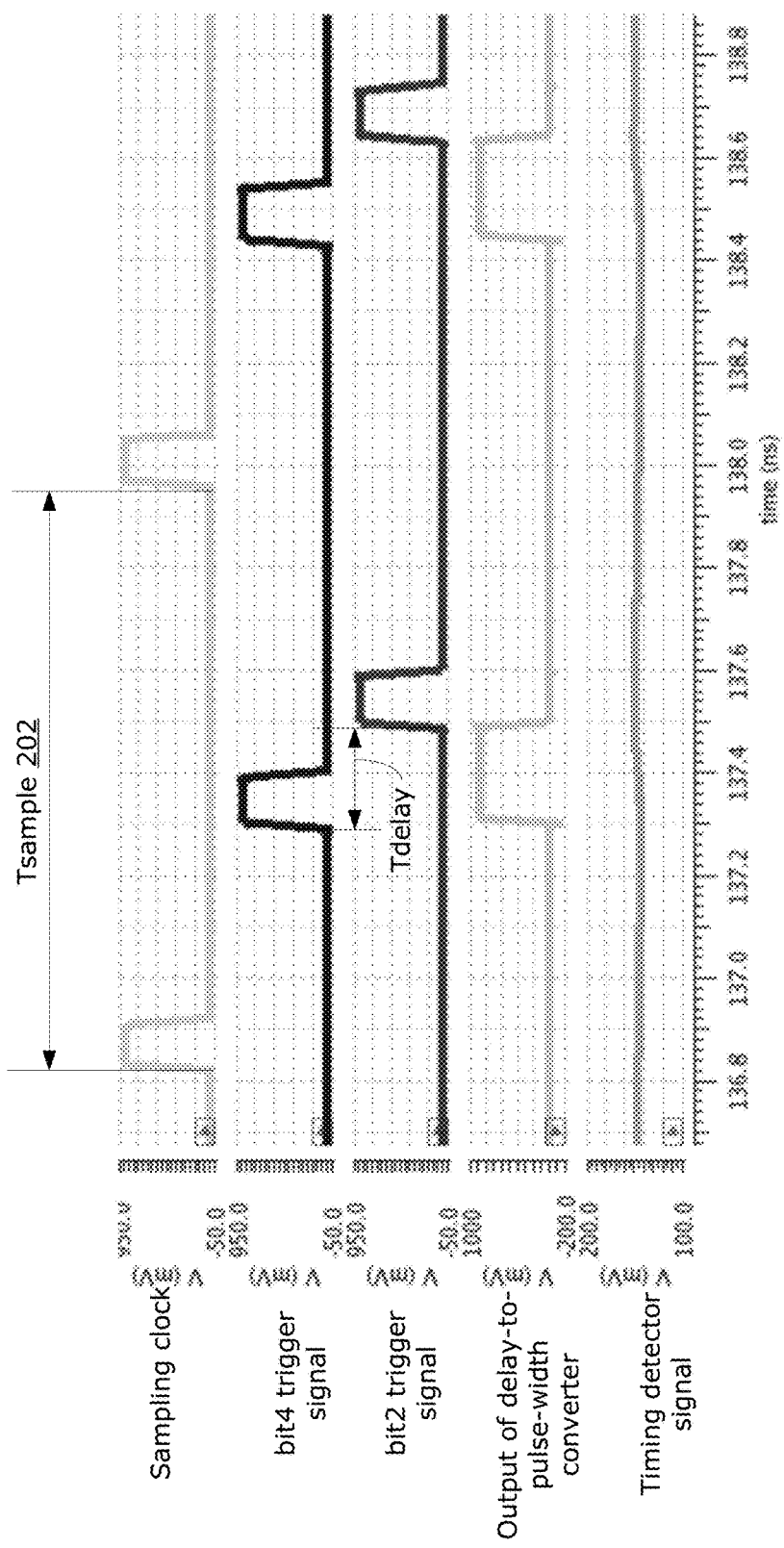
FIG. 7 is an example timing diagram illustrating detection of inter-bit delay in a SAR ADC.

FIG. 7 shows another set of example voltages for the example system 400, in which the Tdelay detected by the timing detector circuit 302 is the time between bit4 and bit2. In this example, bit4 and bit2 internal signals from the SAR ADC 100 are internal signals 310 provided to the timing detector circuit 302. FIG. 7 demonstrates that the example system 400 may be used to provide feedback control for delay between any internal signals in the SAR ADC 100, based on any internal signals 310, and that delay between any internal signals may be used as a metric for feedback control and optimization of the SAR ADC 100. The example system 400 may also be used to monitor delay between an internal signal and one of the edges of the external clock.

Examples described herein provide feedback control for automatically regulating the internal timing of a SAR ADC. Conventional SAR ADCs, without feedback control, typically exhibit large variations in Tcycle at process corners. Simulations have found Tcycle variations of around 20% across different process corners. In contrast, with feedback control as provided by example circuits and closed-loop systems described herein, Tcycle may be maintained relatively constant (e.g., less than 1% variation) over different process corners. Simulations have found that such feedback control may be based on measurement of Tcycle, as well as measurement of inter-bit delay (e.g., between bit4 and bit2).

Figure 8:
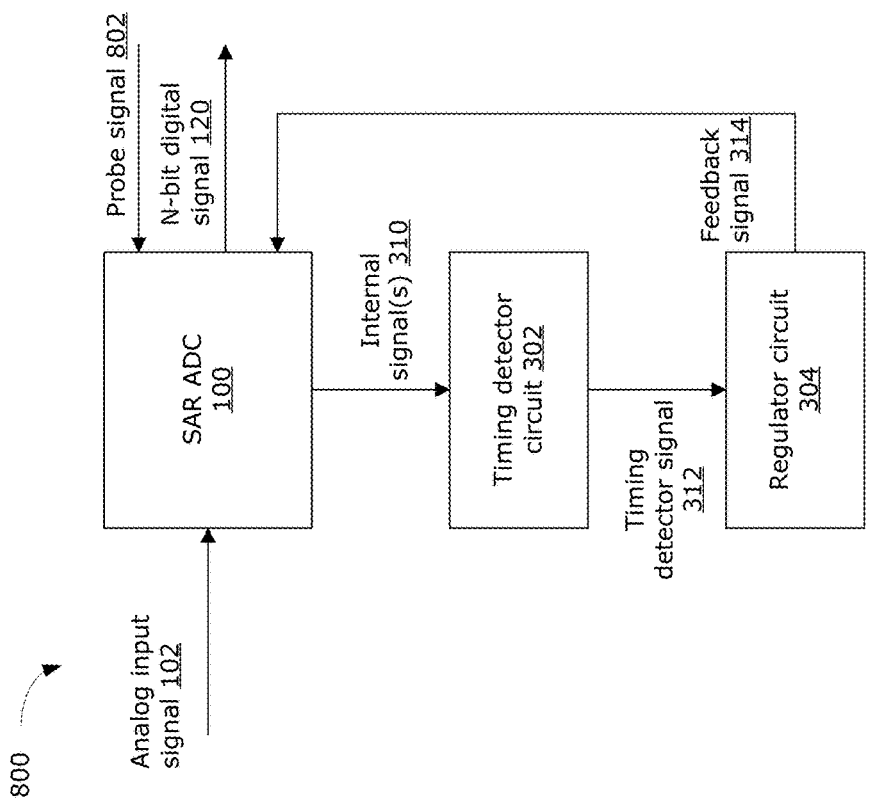
FIG. 8 is a schematic diagram illustrating another example system for a SAR ADC, including a feedback loop for controlling timing of a SAR ADC.

FIG. 8 is a schematic diagram illustrating another example closed-loop system for the SAR ADC 100, including another example implementation of the feedback circuit. The example system 800 is similar to the system 300 of FIG. 3, with the addition of a probe signal 802. In the example system 800, a probe signal 802 is provided to the SAR ADC 100 to probe an internal parameter of the SAR ADC 100. The probe signal 802 is intended to cause the internal signal 310 from the SAR ADC 100 to exhibit a detectable change, such change being detectable by the timing detector circuit 302 as a metric for the internal asynchronous clock of the SAR ADC 100. For example, the probe signal 802 may insert an analog delay to affect the conversion time budget, thus affecting whether the least significant bit (LSB) has enough time to converge.

FIGS. 9A-9C is a diagram illustrating an example of how the internal speed of the SAR ADC 100 may be monitored by insertion of a controllable analog delay. FIG. 9A shows normal operation of the SAR ADC 100, without an inserted analog delay. In this diagram, it is assumed that the length of Tcycle 206 has a sample to sample variation within the range indicated by the dotted lines. Over multiple samples, the average value of the least significant bit, bit1, is expected to be 0.5 (assuming equal possibilities for bit1 to have value of 1 or 0). In this example, the bit value of bit1 is provided as an input signal to the timing detector circuit 302. The timing detector circuit 302 in this example includes a digital averaging circuit to calculate the average value of bit 1 (bit1_avg). FIGS. 9B and 9C illustrate how the insertion of an analog delay 902 at the beginning of Tcycle pushes bit1 later and later, until bit1 falls outside of Tsample. When bit1 is pushed outside of Tsample, the value of bit1 is lost and the average value of bit1 falls to 0.

The probe signal 802 sets the duration of the analog delay 902. In particular, the probe signal 802 may set the analog delay 902 to be a target value that indicates a desired margin of time between Tcycle and Tsample (this margin of time is also referred to as the waiting time, and is the time requirement to guarantee SAR operation within desired bit error rate (BER) requirements). The timing detector circuit 302 digitally averages the bit1 output, detects when bit1_avg falls to 0 and outputs a signal accordingly. The feedback control loop, via the regulator circuit 304, may then control one or more parameters associated with ADC speed (e.g., internal currents, delays or supply voltage, among others) until the speed of the SAR ADC 100 is such that the Tcycle length is just at the border at which the value of bit1 would be lost. This means that the desired waiting time has been achieved.

Although the value of bit1 is intentionally corrupted, this corruption may be acceptable because bit1 is the LSB and is corrupted only for a short period of time to adjust the waiting time of the SAR ADC 100. The probing of the SAR ADC 100 may be performed for setting the waiting time of the SAR ADC 100 at start-up or initial calibration, or for setting the waiting time of the SAR ADC 100 at fixed time intervals or after a preset number of samples. For example, the probe signal 802 may be active at start-up or at the preset time, and after the waiting time has been set and the internal speed of the SAR ADC 100 has been adjusted, the probe signal may be inactive and the operation of the SAR ADC 100 may be undisturbed until probe signal 802 is active again.

In some examples, the probe signal 802 may also be used in an open-loop circuit, for example for detection of the ADC waiting time (without further adjusting the waiting time). In such an application, the probe signal 802 may, instead of setting the analog delay 902 to be a target value, vary the analog delay 902 over a range of values in order to find the amount of delay at which the value of bit1 is lost. The minimum amount of analog delay 902 that causes the loss of bit1 indicates the waiting time. This information may be useful for measuring ADC performance.

In examples disclosed herein, circuits and systems for detecting the average speed of an internal asynchronous clock, using different metrics, are described, as well as feedback circuits for controlling the speed of the asynchronous clock. The feedback circuit may enable the SAR ADC to be designed for performance under typical use, rather than being over-designed to account for possible worst-case scenarios.

The present disclosure may be applicable for electrical circuits as well as optical circuits. The example circuits disclosed herein may be implemented in any suitable system, including any suitable network system, storage system, computing system, mobile system, data-center, switches or routers.

The feedback control loop may be run in the background when the SAR ADC is in mission mode, without impacting the performance of the SAR ADC. This may enable background control of the SAR ADC to enable the SAR ADC to adapt to different conditions (e.g., changing temperatures). Examples of the feedback circuit may be implemented within a relatively small area, enabling implementation in a variety of applications. The detection of internal timing may have very fine resolution (e.g., on the order of a few picoseconds).

In some examples, the feedback circuits and control loops disclosed herein may be used to optimize the performance of individual sub-channels of an interleaved SAR ADC. For example, each sub-channel of the interleaved SAR ADC may be provided with an individual feedback circuit, and the target desired speed for each sub-channel may be individually controlled (e.g., more power to speed up conversion may be provided only for under-performing sub-channels). This may enable different sub-channels to have different speeds, and may avoid over-designing all sub-channels for the worst-case scenario. For chips having very high numbers of interleaved sub-channels (e.g., 150 links each with 32 sub-channels), the power savings may be substantial.

Figure 10:
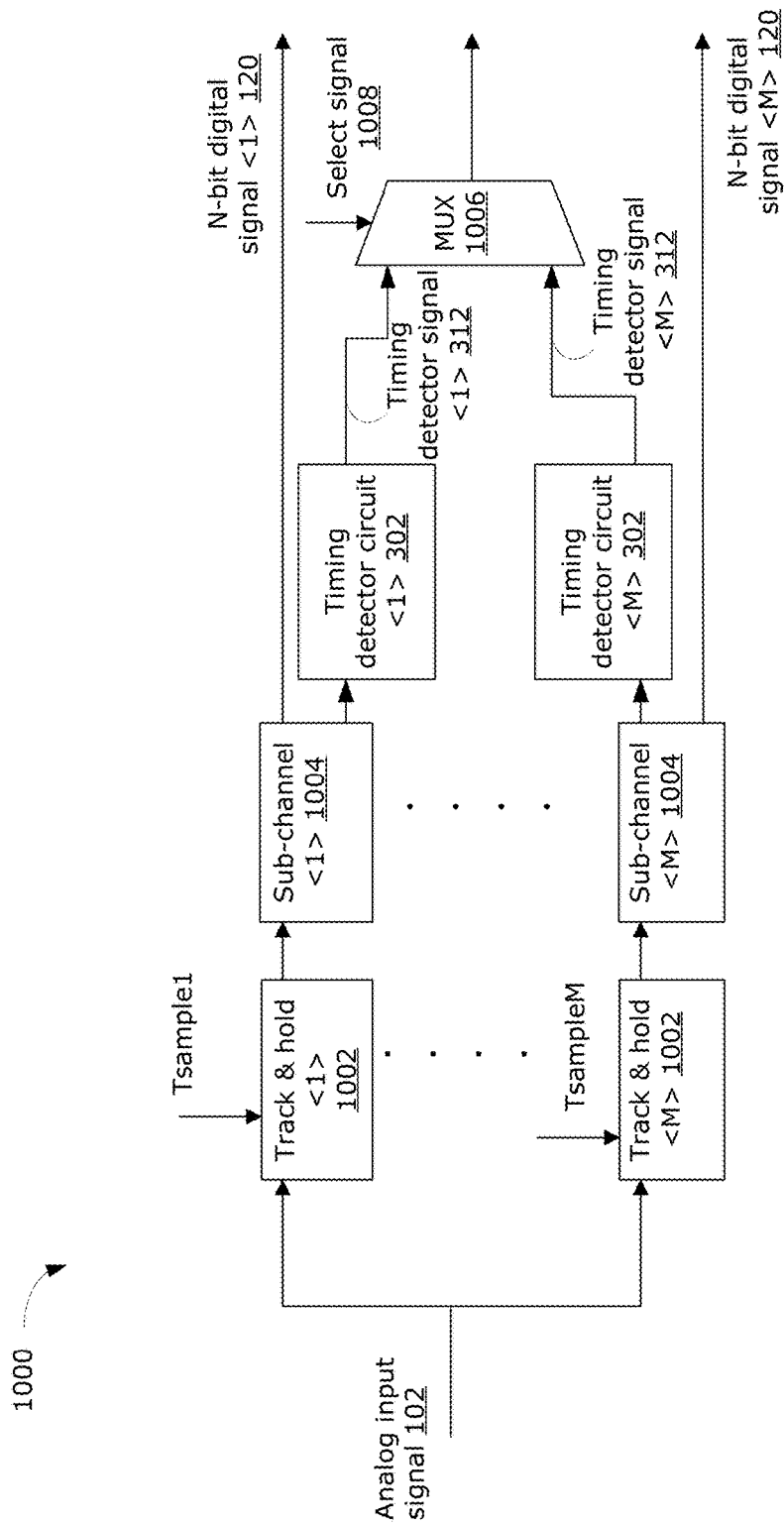
FIG. 10 is a schematic diagram of an example system for an interleaved multi-channel SAR with feedback control loop.

FIG. 10 is a schematic diagram illustrating an example closed-loop system 1000 for feedback control of an interleaved SAR ADC. For simplicity, FIG. 10 shows only how to output the information from the timing detector circuit and does not show the feedback loop for each sub-channel. However, the feedback loop, such as discussed above, may be applied for each sub-channel individually, through digital control for example. Alternatively, the feedback loop may be omitted, such as where only a measurement of sub-channel performance, without feedback control, is desired.

In the example of FIG. 10, the analog input signal 102 is sampled by M track & hold circuits 1002 for M sub-channels 1004 of the interleaved SAR ADC. Each sub-channel 1004 outputs a respective N-bit digital signal 120. Samples for each sub-channel 1004 may be sampled at a respective Tsample1 . . . M. Each sub-channel 1004 is provided with a respective timing detector circuit 302, which may be any suitable timing detector circuit 302 as discussed above. The M timing detector circuits 302 generate respective timing detector signals 312. In the example shown, the M timing detector signals 312 are inputted to a multiplexer (MUX) 1006. A select signal 1008 (e.g., from a processor (not shown)) may then select one of the M timing detector signals 312 to output (e.g., to a processor for analysis, or to a regulator circuit to provide feedback control). In some examples, the MUX 1006 may be omitted.

Each sub-channel 1004 of the interleaved SAR ADC may be provided with the respective timing detector circuit 302, with or without the regulator circuit (that is, in a closed-loop or open-loop arrangement), to obtain respective timing detector signals 312 as metrics representing the speed of each sub-channel 1004. This may enable the speed of each individual sub-channel 1004 to be detected, for characterization of individual sub-channels 1004 of the interleaved SAR ADC, with or without feedback control. The characterization information may be used by a processor for selecting a particular sub-channel 1004 to carry a particular signal (e.g., to place a signal with greater number of bits on a faster sub-channel 1004).

In the feedback control loops disclosed herein, the speed of the SAR ADC may be controlled to match a target desired speed and/or to achieve a target desired waiting time. The target speed may be set to be close to the speed of the external sampling clock, to keep power usage low for example. The target desired waiting time may be set to meet certain BER requirements, for example.

Although described in the context of a feedback circuit, in some examples the timing detector circuit may be used to obtain a metric of the internal timing of the SAR ADC, without providing feedback control. For example, the timing detector circuit may be used to characterize the SAR ADC, or to characterize individual sub-channels of an interleaved SAR ADC.

Because the SAR ADC internal clock speed is defined mostly by digital internal delays, the detection of internal timing of the SAR ADC may also be used as a metric for detecting manufacturing process corners and/or the temperature. In some cases, the feedback signal provided by the example disclosed feedback circuit may be used to optimize power usage of other circuits, such as a clock tree, clock divider, or phase lock loops (PLL); or external circuits, such as voltage regulators, related to the SAR ADC. For example, CMOS process corner detection may be possible, where the detected SAR speed indicates the process corner. This may be used to replace a ring voltage-controlled oscillator (VCO) approach for process corner detection.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A system for feedback control of an asynchronous successive approximation register (SAR) analog-to-digital converter (ADC), comprising:

the asynchronous SAR ADC configured to receive an analog input signal and output a digital output signal, the SAR ADC configured to receive an external sampling clock for sampling the analog input signal and configured to generate an asynchronous internal timing related to conversion of the analog input signal;

a timing detector circuit coupled to the asynchronous SAR ADC to receive one or more internal signals from the asynchronous SAR ADC, the timing detector circuit configured to output a timing detector signal representing the internal timing of the SAR ADC, the timing detector signal being generated based on the one or more internal signals; and a regulator circuit coupled to the timing detector circuit to receive the timing detector signal, the regulator circuit also coupled to the asynchronous SAR ADC to output a feedback signal to the asynchronous SAR ADC, the feedback signal being generated based on the timing detector signal to automatically regulate the internal timing of the SAR ADC to match a target timing.

2. The system of claim 1 wherein the one or more internal signals comprise at least two trigger signals indicating respective events at the SAR ADC, and wherein the timing detector signal is generated to represent the internal timing by representing an average time delay between the events based on the at least two trigger signals.

3. The system of claim 2 wherein the timing detector circuit comprises a delay-to-pulse-width converter for converting time delay between the events to a pulse width of a pulse signal, wherein a duty cycle of the pulse signal is directly proportional to a ratio of the time delay to a cycle of the external sampling clock.

4. The system of claim 3 wherein the timing detector circuit further comprises a low-pass filter for converting the duty cycle to the timing detector signal having a voltage proportional to an average duty cycle.

5. The system of claim 2 wherein the at least two trigger signals comprise a first trigger signal indicating a pulse of the external sampling clock and a second trigger signal indicating a last bits of a digitized sample, wherein the average time delay is equal to an average cycle of an asynchronous internal clock of the SAR ADC.

6. The system of claim 1 wherein the SAR ADC is configured to receive a probe signal, the probe signal causing a change in the one or more internal signals, the change in the one or more internal signals being indicative of the internal timing of the SAR ADC.

7. The system of claim 6 wherein the one or more internal signals comprise a bit value signal representing a value of a bit of the digital output signal, wherein the probe signal inserts an analog delay in the conversion of the analog input signal, and wherein the timing detector signal is generated to represent the internal timing by calculating an average value of the bit, wherein the average value of the bit is changed when the inserted analog delay exceeds a waiting time of the SAR ADC.

8. The system of claim 1, wherein the regulator circuit generates the feedback signal based on a comparison of the timing detector signal to a target value representing the target timing.

9. A circuit for detecting an internal timing of an asynchronous successive approximation register (SAR) analog-to-digital converter (ADC), the circuit comprising:
a timing detector circuit coupled to the asynchronous SAR ADC to receive one or more internal signals from the asynchronous SAR ADC, the timing detector circuit configured to output a timing detector signal representing a measurement of the internal timing of the SAR ADC, the timing detector signal being generated based on the one or more internal signals.

10. The circuit of claim 9 wherein the one or more internal signals comprise at least two trigger signals indicating respective events at the SAR ADC, and wherein the timing detector signal is generated to represent an average time delay between the events based on the at least two trigger signals.

11. The circuit of claim 10 wherein the timing detector circuit comprises a delay-to-pulse-width converter for converting time delay between the events to a pulse width of a pulse signal, wherein a duty cycle of the pulse signal is directly proportional to a ratio of the time delay to a cycle of an external sampling clock.

12. The circuit of claim 11 wherein the timing detector circuit further comprises a low-pass filter for converting the duty cycle to the timing detector signal having a voltage proportional to an average duty cycle.

13. The circuit of claim 10 wherein the at least two trigger signals comprise a first trigger signal indicating a pulse of the external sampling clock and a second trigger signal indicating a last bits of a digitized sample, wherein the average time delay is equal to an average cycle of an asynchronous internal clock of the SAR ADC.

14. The circuit of claim 9 wherein the SAR ADC is configured to receive a probe signal, the probe signal causing a change in the one or more internal signals, the change in the one or more internal signals being indicative of the internal timing of the SAR ADC.

15. The circuit of claim 14 wherein the one or more internal signals comprise a bit value signal representing a value of a bit of the digital output signal, wherein the probe signal inserts an analog delay in the conversion of the analog input signal, and wherein the timing detector signal is generated to represent the internal timing by calculating an average value of the bit, wherein the average value of the bit is changed when the inserted analog delay exceeds a waiting time of the SAR ADC.

16. A system for feedback control of an interleaved asynchronous successive approximation register (SAR) analog-to-digital converter (ADC), comprising:
the interleaved asynchronous SAR ADC having multiple sub-channels, each sub-channel having a respective internal timing related to conversion of an analog input signal to a digital output signal; and
a plurality of timing detector circuits, each timing detector circuit being coupled to a respective sub-channel for detecting the internal timing of the respective sub-channel, each timing detector circuit configured to output a respective timing detector signal representing the internal timing of the respective sub-channel.

17. The system of claim 16 further comprising:
a plurality of regulator circuits, each regulator circuit being coupled to a respective timing detector circuit to receive the respective timing detector signal, the regulator circuit also coupled to the respective sub-channel to output a feedback signal to the respective sub-channel, the feedback signal being generated based on the timing detector signal to control the internal timing of the respective sub-channel to match a respective target timing.

18. The system of claim 16 wherein each timing detector circuit is coupled to receive at least two trigger signals from the respective sub-channel, the at least two trigger signals indicating respective events at the respective sub-channel, and wherein the respective timing detector signal is generated to represent the internal timing of the respective sub-channel by representing an average time delay between the events based on the at least two trigger signals.

19. The system of claim 18 wherein each timing detector circuit comprises a delay-to-pulse-width converter for converting time delay between the events to a pulse width of a pulse signal, wherein a duty cycle of the pulse signal is representative of the time delay, and wherein the timing detector circuit further comprises a low-pass filter for converting the duty cycle to the respective timing detector signal having a voltage proportional to an average duty cycle.

20. The system of claim 16 wherein each timing detector circuit coupled to receive a bit value signal from the respective sub-channel, the bit value signal representing a value of a bit output from the respective sub-channel, wherein each sub-channel receives a respective probe signal causing insertion of an analog delay, and wherein the respective timing detector signal is generated to represent the internal timing of the respective sub-channel by calculating a respective average value of the bit, wherein the respective average value of the bit is changed when the inserted analog delay exceeds a respective waiting time of the respective sub-channel.

* * * * *